United States Patent
Braun et al.

(10) Patent No.: US 10,991,092 B2
(45) Date of Patent: Apr. 27, 2021

(54) MAGNETIC RESONANCE IMAGING QUALITY CLASSIFICATION BASED ON DEEP MACHINE-LEARNING TO ACCOUNT FOR LESS TRAINING DATA

(71) Applicant: Siemens Healthcare GmbH, Erlangen (DE)

(72) Inventors: Sandro Braun, Karlsruhe (DE); Boris Mailhe, Plainsboro, NJ (US); Xiao Chen, Princeton, NJ (US); Benjamin L. Odry, West New York, NJ (US); Mariappan S. Nadar, Plainsboro, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 154 days.

(21) Appl. No.: 16/214,339

(22) Filed: Dec. 10, 2018

(65) Prior Publication Data
US 2020/0051239 A1 Feb. 13, 2020

Related U.S. Application Data

(60) Provisional application No. 62/717,997, filed on Aug. 13, 2018.

(51) Int. Cl.
*G06T 7/00* (2017.01)
*G01R 33/54* (2006.01)
(Continued)

(52) U.S. Cl.
CPC .......... *G06T 7/0012* (2013.01); *G01R 33/543* (2013.01); *G01R 33/5608* (2013.01);
(Continued)

(58) Field of Classification Search
CPC ......... G06T 7/0012; G06T 2207/30168; G06T 2207/20084; G06T 2207/20081;
(Continued)

(56) References Cited

U.S. PATENT DOCUMENTS 6,819,790 B2 * 11/2004 Suzuki .................. G06T 7/0012
382/130
10,635,943 B1 * 4/2020 Lebel .................... G06K 9/6257
(Continued)

OTHER PUBLICATIONS

Koller, C J, J P Eatough, P J Mountford, and G Frain. "A Survey of MRI Quality Assurance Programmes." The British Journal of Radiology 79, No. 943 (Jul. 2006): 592-96. doi:10.1259/bjr/67655734.
(Continued)

*Primary Examiner* — Ming Y Hon

(57) ABSTRACT

For classifying magnetic resonance image quality or training to classify magnetic resonance image quality, deep learning is used to learn features distinguishing between corrupt images base on simulation and measured similarity. The deep learning uses synthetic data without quality annotation, allowing a large set of training data. The deep-learned features are then used as input features for training a classifier using training data annotated with ground truth quality. A smaller training data set may be needed to train the classifier due to the use of features learned without the quality annotation.

15 Claims, 2 Drawing Sheets

(51) Int. Cl.
*G01R 33/56* (2006.01)
*G06K 9/03* (2006.01)
*G06K 9/62* (2006.01)

(52) U.S. Cl.
CPC .......... G06K 9/036 (2013.01); G06K 9/6215 (2013.01); G06K 9/6257 (2013.01); G06K 9/6259 (2013.01); G06K 9/6269 (2013.01); *G06T 2207/10088* (2013.01); *G06T 2207/20081* (2013.01); *G06T 2207/20084* (2013.01); *G06T 2207/30168* (2013.01)

(58) Field of Classification Search
CPC ........ G06T 2207/10088; G06K 9/6269; G06K 9/6259; G06K 9/6257; G06K 9/6215; G06K 9/036; G06K 2209/05; G01R 33/5608; G01R 33/543
See application file for complete search history.

(56) References Cited

U.S. PATENT DOCUMENTS

| | | | | |
|---|---|---|---|---|
| 2012/0127297 A1* | 5/2012 | Baxi | .................... | G06K 9/036 348/79 |
| 2013/0051644 A1* | 2/2013 | Nett | .................... | G06T 11/008 382/131 |
| 2013/0083978 A1* | 4/2013 | Frederick | .............. | G06F 19/321 382/128 |
| 2014/0086465 A1* | 3/2014 | Wu | ......................... | G06T 7/143 382/131 |
| 2017/0221199 A1* | 8/2017 | Chang | .................. | G06T 11/008 |
| 2017/0372155 A1* | 12/2017 | Odry | ..................... | G16H 50/20 |
| 2018/0012107 A1* | 1/2018 | Xu | ........................ | G06K 9/6267 |
| 2018/0130213 A1* | 5/2018 | Yan | .......................... | G06T 7/10 |
| 2018/0374245 A1* | 12/2018 | Xu | .......................... | G06T 5/005 |
| 2019/0164268 A1* | 5/2019 | Gallo | ................. | G06K 9/00664 |
| 2019/0228547 A1* | 7/2019 | Chandarana | ......... | G06N 3/0481 |
| 2020/0116810 A1* | 4/2020 | Wang | ..................... | G01R 33/58 |

OTHER PUBLICATIONS

Gedamu, Elias L., D.L. Collins, and Douglas L. Arnold. "Automated Quality Control of Brain MR Images." Journal of Magnetic Resonance Imaging 28, No. 2 (Aug. 2008): 308-19. doi:10.1002/jmri.21434.

Heckel, Frank, Felix Arlt, Benjamin Geisler, Stephan Zidowitz, and Thomas Neumuth. "Evaluation of Image Quality of MRI Data for Brain Tumor Surgery." In SPIE Medical Imaging, 97871L-97871L. International Society for Optics and Photonics, 2016.

Meding, Kristof, Alexander Loktyushin, and Michael Hirsch. "Automatic Detection of Motion Artifacts in MR Images Using CNNs." In Acoustics, Speech and Signal Processing (ICASSP), 2017 IEEE International Conference on, 811-815. IEEE, 2017.

S. Arroyo-Camejo, B. Odry, L. Liu, X. Chen, M.S. Nadar. "Towards Contrast-Independent Automated Motion Detection Using 2D Adversarial DenseNets." Siemens Healthineers, Magnetic Resonance, Oct. 2018. p. 1-1.

Sandro Braun, Xiao Chen, Boris Mailhe, Benjamin L. Odry, and Mariappan S. Nadar. "Motion Detection and Quality Assessment of MR images with Deep Convolutional DenseNets" Siemens Healthineers, Medical Imaging, Oct. 2018. p. 1-1.

* cited by examiner

MAGNETIC RESONANCE IMAGING QUALITY CLASSIFICATION BASED ON DEEP MACHINE-LEARNING TO ACCOUNT FOR LESS TRAINING DATA

RELATED APPLICATION

The present patent document claims the benefit of the filing date under 35 U.S.C. § 119(e) of Provisional U.S. Patent Application Ser. No. 62/717,997, filed Aug. 13, 2018, which is hereby incorporated by reference.

BACKGROUND

The present embodiments relate to quality in magnetic resonance (MR) or other imaging. Image quality is dependent on various parameters before and during the acquisition. Before the acquisition, calibration and defects influence the resulting quality. During the acquisition, patient movement is a significant factor. Being able to assess motion severity and/or other artifacts at scan time may improve the imaging workflow efficiency by triggering a rescan while the patient is still on table instead of having to recall the patient at a later date.

Image quality assessments in MR imaging use a set of hand-crafted features or a signal-to-noise (SNR) estimation based on foreground and background noise estimation. Data-drive algorithms have been proposed, such as modeling the quality in a classification task using a convolutional neural network. Such classification models suffer from the fact of requiring a large amount classified data with which to train the model. A large enough annotated data set may not be available. Even with enough data, a difference in the quality perception and requirement among different clinical personnel may require a trained model for each use-case.

SUMMARY

By way of introduction, the preferred embodiments described below include methods, systems, and instructions in non-transitory computer readable media for classifying MR image quality or training to classify MR image quality. Deep learning is used to learn features distinguishing between corrupt images base on simulation and measured similarity. The deep learning uses synthetic data without quality annotation, allowing a large set of training data. The deep-learned features are then used as input features for training a classifier using training data annotated with ground truth quality. A smaller training data set may be needed to train the classifier due to the use of features learned without the quality annotation.

In a first aspect, a method is provided for classifying quality of an image from a magnetic resonance system. The magnetic resonance system generates an image of a patient. Feature values are determined as output in response to application of the image to a machine-learned regressor network. The machine-learned regressor network was trained to predict an image metric based on simulation of corrupted images. The quality of the image is classified in response to application of the feature values to a machine-learned classifier. The patient is rescanned by the magnetic resonance system when the quality is below a threshold.

In a second aspect, a method is provided for training of classification of image quality. Artifacts are simulated in input images. The simulation results in artifact images from the input images. A machine deep learns to predict a degree of similarity of the artifact images to the respective input images. The machine trains a classifier from training data with ground truth annotations of the image quality and input features learned from the deep learning. The machine-trained classifier and a machine-learned network from the deep learning are stored.

In a third aspect, a system is provided for magnetic resonance image quality assessment. A magnetic resonance scanner is configured to generate data representing a patient. An image processor is configured to generate values of features of the data with a machine-learned network of deep learned features learned without quality annotation and to determine the image quality with a machine-learned classifier based on the values. A display is configured to display an indication of the image quality.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

Deep image quality control is provided for MR imaging. To deal with having a limited number of quality-annotated samples for machine training a classifier, a two-stage process is provided. The need for an extensive amount of annotated data may be overcome to a certain extent by training a regressor from synthetic data. The classifier may then be trained on less data by using features learned in the regression.

The examples herein are for MR imaging. In other embodiments, other types of imaging may be used. Other example types of imaging may be other types of medical imaging (e.g., computed tomography or ultrasound) or imaging in other environments. The examples below deal with motion artifacts, but other types of artifacts may be used. The examples below are from MR imaging of the brain, but imaging of other types of anatomy may be used.

Figure 1:
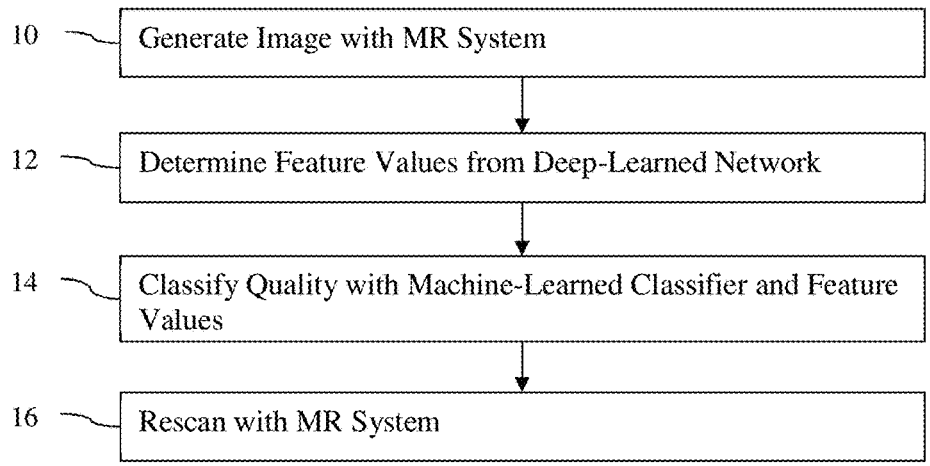
FIG. 1 is a flow chart diagram of one embodiment of a method for classifying quality of an image from a magnetic resonance system.

FIG. 1 is a flow chart of one embodiment of a method for classifying quality of an image from a magnetic resonance system. An image of a patient is classified as having sufficient quality or not. The classification is based on machine-learned features learned by deep learning for imaging metrics other than the quality. These learned features are used as input features for machine-learned classification of the quality.

Figure 4:
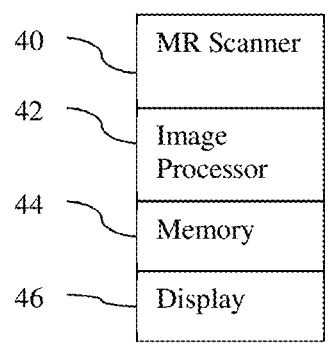
FIG. 4 is a block diagram of one embodiment of a system for magnetic resonance image quality assessment.

The method is implemented by a machine, such as the system of FIG. 4, an MR scanner, a computer, workstation, server, or other processing component. In one embodiment, an MR scanner performs act 10. An image processor, such as part of the MR scanner or part of a workstation, performs acts 12 and 14. The image processor, in conjunction with the MR scanner performs act 16. Other devices may perform any of the acts.

The acts are performed in the order shown (numeric or top-to-bottom), but other orders may be used. Additional, fewer, or different acts may be provided. For example, act 16 is not performed, such as where the image from a scan of a patient has enough quality.

In act 10, a magnetic resonance system generates a representation of a patient. A medical MR scanner generates an image representing a patient. The image is made available by or within the medical scanner. The medical image is acquired by the medical MR scanner. Alternatively, the acquisition is from storage or memory, such as acquiring a previously created dataset from a PACS. A processor may extract the data from a picture archive communications system or a medical records database. Acquisition may be through transmission over a network.

The image is medical imaging MR data or an MR dataset. The medical image is a frame of data representing a plane or volume of the patient. The data may be in any format. While the terms image and imaging are used, the image or imaging data may be in a format prior to actual display of the image. For example, the medical image may be a plurality of scalar values representing different locations in a Cartesian, radial, spiral, or polar coordinate format different than a display format. The image or imaging is a dataset that may be used for imaging, such as scan data representing the patient.

The MR data is acquired using a pulse sequence for scanning a patient while the patient is positioned for scanning (e.g., on the patient bed of the MR system). Data representing an interior region of a patient is acquired. A pulse sequence and corresponding sampling line order is used to measure, resulting in k-space data representing the patient. Helical (spiral), Cartesian, rotational (radial), or another scan pattern is used. The k-space data is then reconstructed. Fourier analysis is performed on k-space measurements to reconstruct the data from the k-space into an object space.

The medical image represents tissue and/or bone structure of the patient. Alternatively, the medical image represents flow, velocity, or fluids within the patient. In other embodiments, the medical image represents both flow and structure.

The medical image represents a two-dimensional (2D) or three-dimensional (3D) region of the patient. For example, the medical image represents multiple parallel planes or slices of the patient. A volume may be represented as slices with pixel values or as voxels in 3D. Values are provided for each of multiple locations distributed in two or three dimensions. The medical image is acquired as a frame of data. The frame of data represents the scan region based on measurements made over time following the scan line order or sequence.

The combination of motion and scan line order may result in the occurrence of a motion artifact. The representation acquired in act 10 may include artifact caused by patient motion during the scanning. Other artifacts may be represented in the acquired image, such as due to distortions, inaccuracy in calibration, and/or other sources. The image with a level of motion artifact is generated by the MR scanner due to the motion of the patient. Greater motion and/or motion in different directions or by different body parts may result in different levels or distribution of motion artifact.

In act 12, an image processor determines feature values. The quality of the MR image of the patient is to be determined by classifier. The classifier is a machine-learned classifier that receives values for input features. Rather than using manually programmed features (e.g., Haar wavelets), the features from a machine-learned regressor network are used. The values of the features for a given image are output in response to application of the image to a machine-learned regressor network. The part or layers of a neural network (e.g., convolutional neural network) that learn features are used. The neural network is a deep learned network that includes learned features.

The part of the neural network that learns, in deep learning, to predict or estimate from the learned features is not used. The features are used, but the classification is not used. For example, the deep learned network learns features and uses the features to output an image metric, such as a similarity. The part of the neural network that uses the values of the features to determine the image metric (e.g., similarity) is not used. The part that provides values for the learned features is used for the input to the classification for quality.

Figure 2:
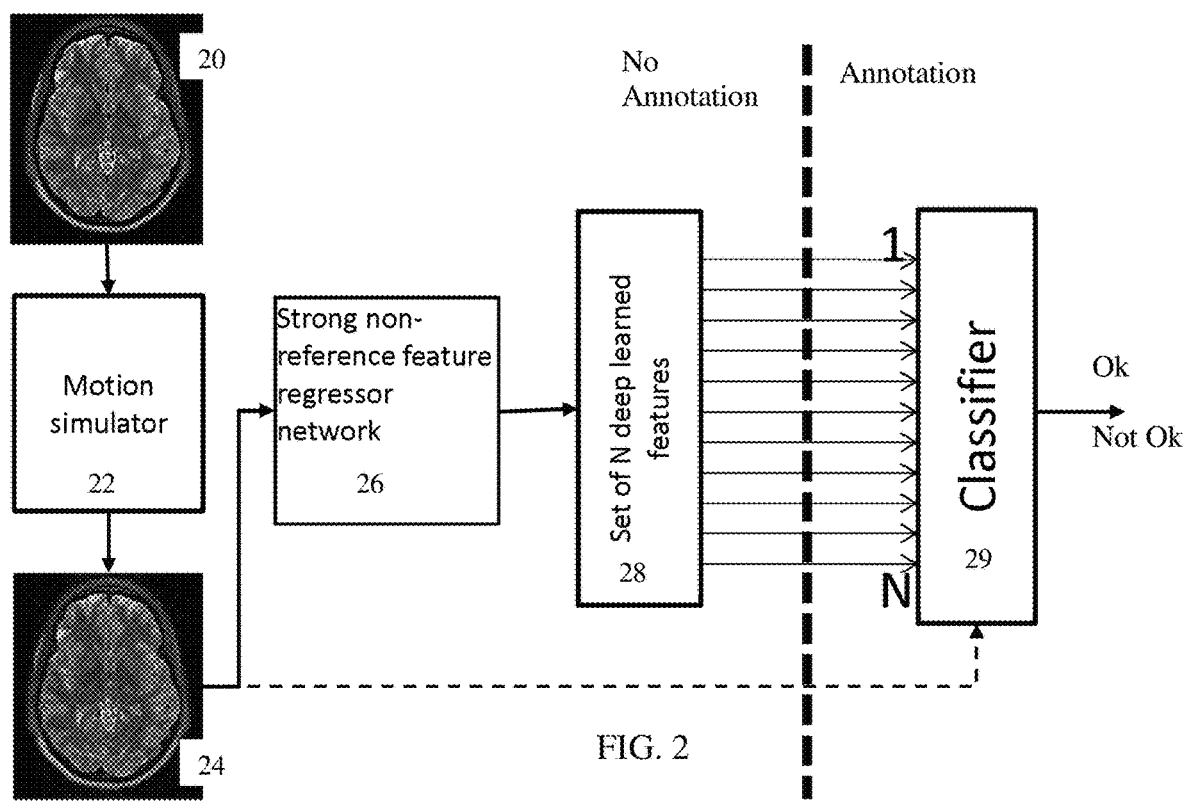
FIG. 2 illustrates an arrangement for classifying quality of an image.

FIG. 2 shows an example. The network 26 is the part of the neural network for generating values of features 28. For testing or application, the image 24 is the image of the patient and includes or does not include artifacts. The image 24 is input to the network 26, which outputs values for N features 28. N is an integer greater than one, such as outputting values for tens, hundreds, or thousands of features 28.

For training the network 26, the motion simulator 22 is used so that a plurality of images 24 with different levels and/or characteristics of motion corruption are generated. Rather than using annotation of quality, synthetic data created by simulation and allowing for quantification of one or more image metrics is used to learn the features 28.

Figure 3:
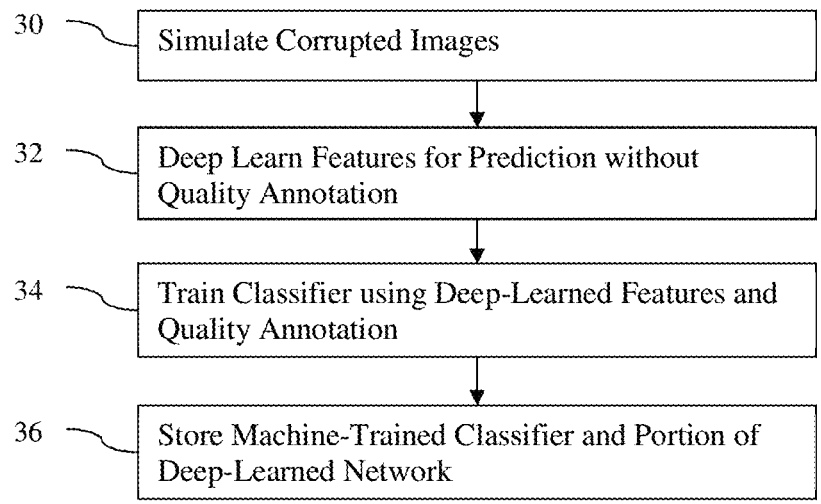
FIG. 3 is a flow chart diagram of one embodiment of a method for training of classification of image quality.

FIG. 3 shows a flow chart of one embodiment of a method for training of classification of image quality. The method includes training with deep learning to learn the features of the network 26 and includes training the classifier 29 (see FIG. 2).

In act 30, a machine (e.g., image processor of a server, MR scanner, or workstation) simulates artifacts in input images 20. Any number of input images 20 are provided, such as tens, hundreds, or thousands. Any number of corrupted or artifact images 24 are simulated by the motion simulator 22 (e.g., image processor simulating motion artifacts) for each input image 20. The corrupted images 24 from a same input image 20 have different corruption characteristics (e.g., level, cause, modeled source, distribution, or other characteristic). The artifact simulator 22 is used to generate corrupted images 24 from available dataset images 20.

In one embodiment, motion corrupted images 24 are generated from subsets of the publicly available dataset HCP of input images 20. The motion model assumes 2D in-plane translational motion for each slice, where the static object is shifted in the image space and then transformed into k-space to mimic data acquisition with motion. The k-space readout is assumed fast enough to freeze any patient motion and only inter-readout motion are simulated. To mimic real MR acquisitions where k-space data may not be collected sequentially, random numbers of motion-affected readout lines are used, and these lines are selected randomly for each 2D k-space. The direction and the magnitude of the displacement are also randomly assigned to each affected line. After replacing all motion-affected readout lines, the k-space data is transformed back into image space as the motion corrupted image 24.

For this simulation of motion to create training data, a ground truth scan of a patient, phantom, or other object with little or no motion is used to form the images 20. Alternatively, images or scan data post-processed to minimize or reduce motion artifacts are used as the images 20. The ground truth scan is a multi-slice, volume, and/or another 3D MR reconstruction, but 2D MR reconstruction may be used. This MR reconstruction is subjected to motion from a motion model, such as 2D or 3D motion based on modeling a person moving while lying on a bed of the MR scanner. Using a scan acquisition order, the 3D representation is created by simulating MR scan and MR reconstruction as if the patient were moving during the scan. Using line order and/or motion change, many examples of reconstructed representations (e.g., corrupted images 24) are formed using the same representation (e.g., input image 20). Other examples may be generated by repetition of simulation with different setting values, thus providing one or more different representations of corrupted images 24.

Other approaches for corrupting the images 20 may be used, such as filtering or adding artifacts in the image domain. A randomized addition of artifact may be used. In one embodiment, a machine-learned network is trained to generate an artifact map or an artifact image given input motion information. The corrupted image 24 is output, or the output artifact is added to the image 20 to form the corrupted image 24.

The simulation generates a set of full-reference image metrics as the targets for a regression network 26. Any image metric may be used. Rather than using annotation of image quality, a measurable metric is used. This measurable metric is an image metric for a difference between the base or origin image 20 and the corrupted image 24. A difference between the ground truth scan and the reconstruction from the simulation indicates the level of motion effect in the MR reconstruction. The reconstructed representations (e.g., corrupted images 24) from the simulation and the differences are used as the training data for the deep learning.

Example image metrics include an L2 distance (e.g. normalized root mean square error), structural similarity index (SSIM) (mean or multi-scale), or other measure of difference or similarity. For each slice, representation, or other image, a value for the image metric between the simulated corrupt image 24 and the original image 20 is calculated. Each metric is then used as target of the regression task.

As motion artifacts in MR images propagate into the background, an object mask computed via histogram analysis may used to separate the foreground (FG) to the background (BG). The value of the image metric may be for the FG, BG, or both.

In one example, the training set includes 230,104 2D slices from 90 T2 weighted volumes including all three orientations. Data augmentation includes random transformations, such as identity, horizontal and vertical mirroring, and 90, 180 and 270 degree rotations. The data split is 90% for training and 10% for validation. Input images 24 are normalized to zero mean and unit standard deviation.

In act 32, a machine performs deep learning using the values of the image metric and the corrupted images. The deep learning learns to predict an amount of similarity or another image metric. The image metric is a relative or absolute measure. The difference between the input image 20 and the simulated corrupt image 24 is measured as the image metric. The deep learning learns to estimate the value for the image metric for a given input corrupted image. Due to repetitions of the simulations in act 30, many samples of corrupted images and corresponding values of the image metric are available for deep learning.

The same or different machine used to create the training data (e.g. perform the simulation in act 30) is used to train. For example, one or more workstations generate the training data (e.g., corrupted images and respective values of the image metric for each). One of the workstations or a different processor (e.g., server) trains using machine learning from the examples, which are stored in a database or other memory.

Any machine learning may be used. In one embodiment, deep learning is used. Using a piecewise-differentiable function or other deep learning function, the machine trains a network to output a score (e.g., value of image metric) in response to an input image. The machine trains the network through regression. The machine training is unsupervised in learning the features to use and how to classify given the learned feature vector. A deep neural network is trained to estimate with a $L_2$ loss (e.g., least squares error) or other loss to obtain optimal network parameters. For example, the network is trained with a batch size of 20 and the Adam optimizer with a learning rate of 10-4 to minimize the L1-distance. The difference between the measured image metric for the training images and the predictions by the network is minimized.

For deep learning, the classifier learns the features of the input data to extract from the training data. The training relates the input data to the classification through one or more layers. One or more layers relate feature values to the class. For deep-learned networks, there may be further layers creating further abstract features from outputs of pervious layers. The resulting machine-trained classifier is a matrix for inputs, convolution kernels, down-sampling, weighting, and/or combination to output a classification and/or estimated value of the imaging metric. The deep machine-trained network includes two or more portions relating the input to the class. The first portion is one or more layers for providing values of learned features. The second portion is one or more layers for predicting the value of the image metric given the values of the learned features.

Any neural network architecture may be used. For example, a fully convolutional neural network is used. Other deep learned, sparse auto-encoding classifiers may be trained and applied. In one embodiment, a fully convolutional Dense-Net architecture without fully connected layers is trained. For example, a 2D DenseNet regression model yielding a scalar quality score for each 2D input image is used. An adversarial discriminator based on a DenseNet is added for classification of T1 vs. T2 weighted image contrast. The discriminator is fed with the features generated by the regression model at the position of the last layer before pooling. The main goal of the discriminator is to generate features for the regression model that are independent of the contrast (T1w or T2w). The overall regression loss of the generator and discriminator is comprised of the L1-norm of regression target values and scores for the generator and an adversarial term containing the classification loss (cross entropy) of the discriminator. Both the generator and discriminator employ Adam optimization. Other approaches may be used, such as deep learning without the discriminator.

In another embodiment of a network architecture, a plurality of dense blocks is used. The dense blocks include various layers, such as fully connected layers, with one or more skip connections to a final fully connected layer. The dense blocks output to a convolution layer, followed by a pooling layer. The pooling layer outputs to another dense block, which outputs to a convolution layer. The convolution layer outputs to a pooling layer, which outputs to an average pooling or other combination layer for outputting the score. Additional, different, or fewer layers may be used.

Since the measured metrics from the simulation are used for unsupervised training, the deep learning is performed without ground truth annotations of the image quality. A manual annotation is not needed for each sample in the training data. A measurement of the somewhat subjective quality is not needed. Instead, simulation allows for a direct measure of the image metric different than but related to the desired quality output. The network (i.e., the regressor) is trained to predict full-reference metrics from a given corrupted image, hence reference free. The network may be trained to a very high accuracy since self-generated data is almost infinitely available. The simulation creates synthetic data (images not reflecting an actual scan or image of patient), which allows for many samples with a corresponding measurable image metric or metrics. The regressor network is machine trained to predict an image metric based on simulation of corrupted images 24 without annotation of quality. The similarity of the corrupted images 24 to the original uncorrupted images 20 is used to train the network without needing quality annotation.

Referring again to FIGS. 1 and 2, once trained, the machine-learned regressor network 26, having been trained with training data of the corrupted images 24 output by artifact simulation, outputs values for features 28 from the first portion of the network 26. The output estimation of the value of the image metric for an input image is not used. Alternatively, the estimation is also performed, but the values of the features 28 are also output by the first part of the network 26 for use in classification in act 14 by the classifier 29.

In act 14, the machine classifies the quality of the input image 24. In response to input of the values of the features 28, the machine-learned classifier 29 outputs the quality of the image 24. The quality of an image 24 of a patient is classified. Where the corruption is due to motion, the quality is based on the effect of the motion of the patient.

The classification is for any number of classes. FIG. 2 shows a binary classification as "ok" or "not ok." The classifier 29 applies a threshold to a probability output or as incorporated based on the ground truth annotation to output membership in either of the two classes. In other embodiments, three or more classes are provided, such as outputting a quality score in an integer range of 1-5 or 1-10.

The classifier 29 is a random forest, support vector machine, or other trained classifier. Support vector machine, Bayesian network, probabilistic boosting tree, neural network, sparse auto-encoding classifier, random forest, or other now known or later developed machine learning may be used. Any semi-supervised or supervised learning may be used. Hierarchal, cascade, or other approaches may be used.

In act 34 of FIG. 3, a machine trains the classifier 29 from training data with ground truth annotations of the image quality and input features learned from the deep learning of the network 26. The machine training is sequential as the network 26 is trained, and then the classifier 29 may be trained since the features 28 are used as inputs in the training of the classifier 29.

The same or different machine used for the simulation of act 30 and/or the deep learning of act 32 is used in the training or learning of act 34. In one embodiment, the same workstation and/or server is used for all of acts 30-34.

For training the classifier, the features 28 from the network 26 are used. The network 26 is used to determine values of the features 28. Values are determined for each of the sample images in the training data. The deep learned features are used in a second stage to train a simple classifier to predict whether a given image is of acceptable quality or not. The training data may be different than, a sub-set of, or the same images 24 used in training the network 26. Since the classifier 29 is to be trained to distinguish the quality, samples of good and bad quality are included in the training set. The images for the training data are input to the network 26 to provide values for the features 28. These values are used as the samples for training the classifier 29. The estimate of the values of the image metric and corresponding layers may not be used.

In other embodiments, other features are also used. The dashed line from the image 24 to the classifier 29 represents inclusion of other features. The other features may be for the image, such as manually programmed features (e.g., Haar wavelets or steerable features). The other features may be for the patient, such as clinical information (e.g., age, sex, weight, body mass index, family history, genetic information, blood work information . . . ). The classifier 29 is trained to classify the quality based on the features 28 from the network 26 and any other features (e.g., reference-based or traditional features).

For training, each sample includes a ground truth. The annotation of quality of the image is included as the ground truth. For training the classifier 29, annotated data is necessary. Data augmentation from public datasets (which are examples of good-quality scans with respect to motion artifacts) can be used. However, the number of samples in the training data may be less due to the use of the network 26 and corresponding features 28.

In act 36, the machine-learned classifier 29 and the machine-learned network 26 are stored. After creation, the machine-learned networks include one or more layers with values for various parameters, such as convolution kernels, down sampling weights, and/or connections. The values of the parameters and/or the networks as trained are stored. The machine-learned networks are stored in a memory, such as memory of the machine or the database with the examples. The machine-learned networks may be transmitted to a different memory. The machine-learned networks may be duplicated for application by other devices or machines, such as processors of MR scanners. The memories of MR scanners may store copies of the machine-learned networks for application for specific patients, enabling a radiologist or other physician to determine whether to rely on an image or to scan again for diagnosis due to patient motion or another artifact.

Once trained, the classifier 29 receives values of the features 28 for a given image 24 of a patient with or without other features. The machine-learned classifier 29, having been trained to classify the quality based on the values of the features from the machine-learned regressor network 26 where the feature values are based on the prediction of the image metrics, classifies the quality of the input image 24.

In one example, the regressor network 26 is trained using a foreground L infinity loss for deep learning with a dense network. The classifier is machine trained as a support vector machine. The classifier is trained with as few as 160 cases of real annotated data for the case of motion artifacts.

In act 16 of FIG. 1, an image processor or MR scanner determines whether to rescan the patient. The quality is used to determine whether to rescan based on a threshold. The threshold may be the class, such as separating ok and not ok. The threshold may be a user set or default level along a quality scale, such as "3" in a 1-5 scale of quality. If the quality is good (e.g., above or below the threshold), then the image 24 for the patient may be used without rescanning. If the quality is poor (e.g., below or above the threshold), then the image 24 may include too much artifact. The patient is scanned again when the quality is poor.

The scanning is performed again before the patient leaves the table and/or before a given imaging appointment ends for that patient. By getting feedback on quality, the resulting image or images from an appointment for the patient more likely provide diagnostically useful information with less artifact. Rescanning provides the image or images of sufficient quality without the inconvenience of making another imaging appointment and corresponding delay.

The image 24 and the classification of quality are displayed to the operator of the MR scanner. The processor or MR scanner uses a display device to display the quality for the image. The quality score may be transmitted over a network, through a communications interface, into memory or database (e.g., to a computerized patient medical record), or to a display.

The user or the medical scanner uses the quality score. A sufficiently good quality representation (e.g., score or value above or below a threshold) allows for diagnosis with lest risk for error. A poor-quality representation may not be sufficient for diagnosis, so the patient is scanned again. An automatic trigger based on score to scan by the MR scanner may be used. Alternatively, the user triggers the subsequent scan based on the quality score. Once the quality score for motion artifact in an MR image volume is predicted, the medical scanner or the operator of the medical scanner decides whether to rescan the patient. The score is used for a decision to use or not use the generated representation. Menu selections for implementing a rescan may be provided based on the quality score. The result is that a later physician review is more likely to have a useful image for diagnosis, and rescanning is avoided where possible. The score may be used to weight an amount of trust in diagnosis based on a representation from a scan of the patient.

FIG. 4 shows one embodiment of a system for magnetic resonance image quality assessment. The system is for machine learning and/or for application of a machine-learned networks. The system is implemented on the MR scanner 40, but one or both machine-learned networks may be implemented on a server, computer, and/or workstation separate from the MR scanner 40.

The system includes an MR scanner 40, an image processor 42, a memory 44, and a display 46. Additional, different, or fewer components may be provided. For example, network connections or interfaces are provided, such as for networking with a medical imaging network or data archival system. In another example, a user interface is provided. As another example, a server and database are provided for training and/or implementing one or both trained networks.

The image processor 42, memory 44, and display 46 are part of the medical MR scanner 40. Alternatively, the image processor 42, memory 44, and display 46 are part of an archival and/or image processing system, such as associated with a medical records database workstation or server, separate from the MR scanner 40. In other embodiments, the image processor 42, memory 44, and display 46 are a personal computer, such as desktop or laptop, a workstation, or combinations thereof. The image processor 42, display 46, and memory 44 may be provided without other components for acquiring data by scanning a patient.

The MR scanner 40 is a medical diagnostic imaging system. The MR scanner 40 is an MR system. The MR system includes a main field magnet, such as a cryomagnet, and gradient coils. A whole-body coil is provided for transmitting and/or receiving. Local coils may be used, such as for receiving electromagnetic energy emitted by atoms in response to pulses. Other processing components may be provided, such as for planning and generating transmit pulses for the coils based on the sequence and for receiving and processing the received k-space data based on a line order. The received k-space data is converted into object or image space data with Fourier processing. The MR scanner 40 is configured to generate data representing a patient, such as image data in the object domain.

The image processor 42 is a general processor, central processing unit, control processor, graphics processor, neural processing unit, digital signal processor, three-dimensional rendering processor, application specific integrated circuit, field programmable gate array, digital circuit, analog circuit, combinations thereof, or other now known or later developed device for machine training or applying a machine-learned network. The image processor 42 is a single device or multiple devices operating in serial, parallel, or separately. The image processor 42 may be a main processor of a computer, such as a laptop or desktop computer, or may be a processor for handling some tasks in a larger system, such as in the MR scanner 40. The image processor 42 is configured by instructions, design, hardware, and/or software to perform the acts discussed herein.

The image processor 42 is configured to perform the acts discussed above for training and/or application. For training, the image processor 42 or another processor (e.g., a server) generates examples by simulation. Artifact corrupted images are generated. The image processor 42 uses deep machine learning based on the stored and/or created training data and a defined network architecture. Once features for predicting an image metric are learned, the image processor 42 trains a classifier to classify quality using the learned features and ground truth quality.

For application, the image processor 42 uses one deep-learned network to generate values for features and a machine-learned classifier to classify quality from the learned features. The machine-trained networks are stored in the memory 44 for application to an image of a patient from the MR scanner 40 or the memory 44. The image is input to the deep-learned network, which outputs values for learned features. The values are input to the machine-trained classifier, which outputs a quality. The features are based on having learned to predict similarity using synthetic data as training data but are used as inputs to the classifier to classify the quality. The classifier was trained to use the values of the features with annotation of quality as ground truth.

The image processor 42 is configured to transmit the quality over a network, to the display 46, or to the memory 44. The image processor 42 may be configured to generate a user interface for requesting rescanning and/or presenting the quality with or without one or more images of the patient (e.g., the image of the patient for which the quality is provided).

The memory 44 may be a graphics processing memory, a video random access memory, a random-access memory, system memory, cache memory, hard drive, optical media, magnetic media, flash drive, buffer, database, combinations thereof, or other now known or later developed memory device for storing data or video information. The memory 44 is part of the MR scanner 40, part of a computer associated with the image processor 42, part of a database, part of another system, a picture archival memory, or a standalone device.

The memory 44 stores medical imaging data representing the patient, weights or values of parameters making up some of the layers of the machine-learned networks, simulation model parameters, outputs from different layers, one or more machine-learned networks, images, similarities, and/or quality. The memory 44 may store data during processing for application and/or may store training data and data during processing for machine learning.

The memory 44 or other memory is alternatively or additionally a non-transitory computer readable storage medium storing data representing instructions executable by the programmed image processor 42 for training or use of machine-learned networks in medical MR imaging. The instructions for implementing the processes, methods and/or techniques discussed herein are provided on non-transitory computer-readable storage media or memories, such as a cache, buffer, RAM, removable media, hard drive or other computer readable storage media. Non-transitory computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code and the like, operating alone, or in combination. Likewise, processing strategies may include multiprocessing, multitasking, parallel processing, and the like.

In one embodiment, the instructions are stored on a removable media device for reading by local or remote systems. In other embodiments, the instructions are stored in a remote location for transfer through a computer network or over telephone lines. In yet other embodiments, the instructions are stored within a given computer, CPU, GPU, or system.

The display 46 is a monitor, LCD, projector, plasma display, CRT, printer, or other now known or later developed devise for outputting visual information. The display 46 receives images, graphics, text, quantities, or other information from the image processor 42, memory 44, MR scanner 40, and/or a server. One or more medical MR images are displayed. The MR images are of a region of the patient. The image includes an indication, such as a text (annotation), graphic or colorization, of the classification results, such as the quality score. The quality score may be displayed as the image without a medical MR image of the patient. A menu for configuring the MR scanner 40 to rescan and/or indication to rescan may be displayed.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

What is claimed is:

1. A method for classifying quality of an image from a magnetic resonance system, the method comprising:
    generating, by the magnetic resonance system, an image of a patient;
    determining feature values as generated in response to application of the image to a machine-learned regressor network, the machine-learned regressor network having been trained to predict an image metric based on simulation of corrupted images where the feature values are from a first part of the machine-learned regression network other than an output part of the machine-learned regression network, the machine-learned regression network having been trained to use the feature values to output the image metric;
    classifying the quality of the image in response to application of the feature values to a machine-learned classifier; and
    rescanning the patient by the magnetic resonance system when the quality is below a threshold.

2. The method of claim 1 wherein generating the image comprises generating the image with motion artifact due to motion of the patient, wherein the simulation used to train the machine-learned regressor network simulated motion, wherein classifying comprises classifying the quality based on effect of the motion of the patient, and wherein rescanning comprises rescanning when the effect of the motion of the patient results in the quality being below the threshold.

3. The method of claim 1 wherein determining comprises determining by the machine-learned regressor network comprising a deep learned network.

4. The method of claim 3 wherein determining by the deep learned network comprises determining by learned features without using prediction of the image metric.

5. The method of claim 1 wherein determining comprises determining by the machine-learned regressor network having been trained with the simulation of corrupted images, the simulation of corrupted images comprising the corrupted images output by artifact simulation.

6. The method of claim 1 wherein determining comprises determining by the machine-learned regressor network having been trained without annotation of quality.

7. The method of claim 1 wherein determining comprises determining by the machine-learned regressor network having been trained with the image metrics comprising similarity of the corrupted images to uncorrupted images.

8. The method of claim 1 wherein classifying comprises classifying by the machine-learned classifier comprising a random forest or support vector machine.

9. The method of claim 1 wherein classifying comprises classifying with the machine-learned classifier having been trained with ground truth quality for the training data.

10. The method of claim 1 wherein classifying comprises classifying with the machine-learned classifier having been trained to classify the quality based on the features values from the machine-learned regressor where the feature values are based on the prediction of the image metric.

11. The method of claim 1 wherein classifying comprises classifying in response to the application of the feature values and application of other features.

12. The method of claim 1 wherein classifying comprises classifying the quality in a binary classification.

13. The method of claim 1 wherein generating the image comprises generating with the patient on a table, and wherein rescanning comprises rescanning before the patient leaves the table.

14. A system for magnetic resonance image quality assessment, the system comprising:
    a magnetic resonance scanner configured to generate data representing a patient;
    an image processor configured to generate values of deep-learned features with a machine-learned network applied to the data, the deep-learned features having been learned as part of the machine-learned network without quality annotation, the deep-learned features of the machine-learned network being from within the machine-learned network and being different than an output of the machine-learned network, and the image processor configured to determine the image quality with a machine-learned classifier based on the values; and a display configured to display an indication of the image quality.

15. The system of claim 14 wherein the machine-learned network was trained to predict similarity based on synthetic data and wherein the machine-learned classifier was trained to determine the image quality based on annotation of image quality as a ground truth.

* * * * *